United States Patent
Trauth et al.

(10) Patent No.: US 7,786,805 B2
(45) Date of Patent: Aug. 31, 2010

(54) POWER AMPLIFIER MODULE AND A TIME DIVISION MULTIPLE ACCESS RADIO

(75) Inventors: Gerhard Trauth, Muret (FR); Ludovic Oddoart, Frouzins (FR); Jacques Trichet, Cugnaux (FR); Vincent Vanhuffel, Plaisance du Touch (FR)

(73) Assignee: Freescale Semiconductor, Inc., Austin, TX (US)

( * ) Notice: Subject to any disclaimer, the term of this patent is extended or adjusted under 35 U.S.C. 154(b) by 823 days.

(21) Appl. No.: 10/596,366

(22) PCT Filed: Dec. 13, 2004

(86) PCT No.: PCT/EP2004/014169

§ 371 (c)(1),
(2), (4) Date: Jul. 13, 2006

(87) PCT Pub. No.: WO2005/060090

PCT Pub. Date: Jun. 30, 2005

(65) Prior Publication Data

US 2009/0015333 A1    Jan. 15, 2009

(30) Foreign Application Priority Data

Dec. 12, 2003    (EP) .................................. 03293116

(51) Int. Cl.
*H03G 3/10*    (2006.01)
(52) U.S. Cl. ...................... 330/285; 330/297; 330/296; 330/291
(58) Field of Classification Search .................. 330/297, 330/285, 296, 291
See application file for complete search history.

(56) References Cited

U.S. PATENT DOCUMENTS

| 4,320,350 A | * | 3/1982 | Drapac ........................ 330/202 |
| 5,239,275 A | | 8/1993 | Leitch |
| 5,497,125 A | | 3/1996 | Royds |

(Continued)

FOREIGN PATENT DOCUMENTS

EP        0558793 B1    9/1993

(Continued)

OTHER PUBLICATIONS

Application No. PCT/EP2004/014169 PCT International Search Report and Written Opinion dated Apr. 11, 2005.

(Continued)

*Primary Examiner*—Patricia Nguyen

(57) ABSTRACT

A power amplifier module comprises a power amplifier circuit having an output power level controlled by a power supply voltage. A power supply transistor controls the power supply to the power amplifier circuit from a drive signal which is received from a drive circuit. The drive circuit generates the drive signal in response to a power level input signal, which specifically may correspond to a power ramping for a GSM cellular communication system. The power amplifier module furthermore comprises a detection circuit which determines an operating characteristic of the power supply transistor. The operating characteristic is preferably a saturation characteristic. A control circuit controls the drive signal in response to the operating characteristic. The control circuit preferably controls the drive signal such that the power supply transistor does not enter the linear region for a Field Effect Transistor and the saturated region for a bipolar transistor.

20 Claims, 3 Drawing Sheets

U.S. PATENT DOCUMENTS

| | | | |
|---|---|---|---|
| 6,377,784 B2 | 4/2002 | McCune | |
| 6,566,944 B1 | 5/2003 | Pehlke et al. | |
| 6,701,138 B2 * | 3/2004 | Epperson et al. | 455/127.3 |
| 6,781,452 B2 * | 8/2004 | Cioffi et al. | 330/10 |
| 6,825,725 B1 * | 11/2004 | Doherty et al. | 330/289 |
| 6,894,565 B1 * | 5/2005 | Bocock et al. | 330/285 |
| 7,106,137 B2 * | 9/2006 | Dupuis et al. | 330/285 |
| 2002/0074980 A1 | 6/2002 | Sander | |
| 2002/0077066 A1 | 6/2002 | Pehlke et al. | |
| 2002/0137480 A1 | 9/2002 | Hadjichristos et al. | |
| 2002/0183019 A1 | 12/2002 | Dent et al. | |
| 2003/0040343 A1 | 2/2003 | Epperson et al. | |
| 2003/0197556 A1 | 10/2003 | Schell et al. | |

FOREIGN PATENT DOCUMENTS

| | | |
|---|---|---|
| JP | 09-046264 A | 2/1997 |
| JP | 2000-222050 A | 8/2000 |
| WO | 03021766 A2 | 3/2003 |

OTHER PUBLICATIONS

Application No. 03293116.4-2215 EPC International Search Report and Written Opinion dated May 19, 2004.

* cited by examiner

ETSI SPEC:
MIN −80 dB AT 400kHz
MIN −83dB AT 600kHz

POWER AMPLIFIER MODULE AND A TIME DIVISION MULTIPLE ACCESS RADIO

FIELD OF THE INVENTION

The invention relates to a power amplifier module and in particular, but not exclusively, to a power amplifier module for a Time Division Multiple Access (TDMA) radio communication system.

BACKGROUND OF THE INVENTION

In the last century, radio transmission of modulated signals has become one of the most widespread means for communication over distance. In recent years, the use of radio communication has become even more ubiquitous with the advent of e.g. wireless local networks and mobile telephones.

A key parameter in radio communication systems is the design of the power amplifiers that amplify radio signals to power levels suitable for transmission by an antenna. The design and performance of the power amplifiers are particularly critical in order to meet system requirements related to adjacent channel interference, low distortion, high power levels, low battery levels etc.

Furthermore, requirements for the functionality of power amplifiers have tended to become more complex over the years. For example, cellular communication systems not only require high performance operation during transmission but also require that the power output level can be varied over a large dynamic range and can be controlled with a high degree of accuracy.

For example, cellular communication systems use power control loops to adjust the transmit power of radio units (both base stations and mobile stations to reflect the current radio propagation conditions. Thus, a transmission from and to a mobile station at the edge of a coverage area and/or in a propagation fade will be at a high power level whereas transmission from and to a mobile station close to the base station will be performed at significantly lower power levels. Accordingly, the radio units comprise functionality for dynamically controlling the output power level of the power amplifiers.

Furthermore, in particular TDMA cellular communication systems, such as the Global System for Mobile communication (GSM), prescribe a tight temporal and frequency domain envelope mask of the transmitted signal. Specifically, as transmission occurs in short bursts, the cellular communication systems prescribe a specific power ramping during power up and power down in order to reduce the spectral spreading of the signal and thereby the adjacent channel interference.

Accordingly, much research has been conducted in the field of optimisation of power amplifiers. One method proposed for controlling the power output level of a power amplifier comprises regulating the output power level by controlling the power supply to the power amplifier.

FIG. 1 illustrates the principle of power supply regulation of the output power level of a power amplifier in accordance with prior art.

In FIG. 1, a power amplifier circuit 101 is operable to amplify a radio signal for transmission via an antenna (not shown). The power amplifier circuit 101 is provided with a power supply having a voltage Vcc which is controlled by a Field Effect Transistor (FET) 103. The FET 103 has a source connected to a battery providing a battery voltage $V_{Bat}$ and drain connected to a power supply input of the power amplifier circuit 101.

The power amplifier circuit 101 is coupled such that the output power of the power amplifier depends on the supply voltage Vcc. Thus, for a constant envelope radio signal fed to the power amplifier, the output power of the power amplifier circuit 101 is controlled by the value of the supply voltage Vcc.

The gate of the FET 103 is coupled to an operational amplifier (op-amp) 105 which provides a drive signal that controls the supply voltage Vcc. The supply voltage connection to the power amplifier circuit 101 is fed to the non-inverting input of the op-amp 105 through two resistors 107, 109. The PET 103 is a PMOS FET coupled in an inverting configuration. Thus, the coupling between the op-amp 105, the FET 103 and the two resistors 107, 109 forms a conventional feed-back controlled buffer or amplifier circuit providing high input impedance buffering of the input signal Vin of the op-amp 105 such that Vcc is proportional to Vin. In the example, the resistors 107, 109 of the divider both have a value of R thereby resulting in a gain of the control circuitry of two i.e. in that Vcc=2·Vin.

FIG. 1 furthermore illustrates an example of an input signal 111 which controls the power ramping of the power amplifier circuit 101 in connection with transmission of a burst in a TDMA cellular communication system. Specifically, the specific characteristics of the illustrated power ramping are compatible with the Global System for Mobile communication (GSM).

In accordance with the GSM Technical Specifications, a TDMA burst initiates by an approximately 20 μsec long power up ramp and terminates with an approximately 20 μsec long power down ramp. The power up and down ramp effectively removes higher spectral components from the signal thereby significantly reducing adjacent channel interference. Accordingly, the input signal 111 comprises an approximately 20 μsec long power up ramp component followed by a static component for the duration of the burst, followed by an approximately 20 μsec long power down ramp component. For a mobile station, the signal is then zero until the next transmission burst to the base station.

Thus, the input signal to the op-amp 105 controls the temporal power ramping of the power output level.

Although the circuit of FIG. 1 may meet the requirements of e.g. the GSM system, it has a number of associated disadvantages.

One disadvantage is that the circuit of FIG. 1 requires a supply voltage $V_{Bat}$ which is substantially higher than the supply voltage Vcc to the power amplifier circuit 101 in order to guarantee optimal performance. If $V_{Bat}$ is not sufficiently large, the FET 103 will enter the linear region of the operating characteristic of the FET. In the linear region, the FET has little gain and effectively operates more as a variable resistor than as a gain element. This significantly alters the dynamic performance of the control loop and results in degraded transient response and substantially increased adjacent channels spurious.

In order to prevent this effect, the circuit of FIG. 1 is conventionally provided with functionality for clamping the power amplifier circuit supply voltage Vcc to a maximum value which ensures that the FET is still operating with a substantial gain. The clamp voltage is determined to comply with the minimum battery voltage in order to ensure that the FET operates with sufficient gain during the entire battery life cycle. Typically, the clamping is performed by limiting the input voltage Vin to a value which ensures full performance at minimum battery voltage. This clamping of the supply voltage Vcc is necessary to avoid the power amplifier distorting the power ramp shape if the input signal seeks to drive the output power level higher than can be achieved with the clamped supply voltage. This distortion increases adjacent channels spurious.

Furthermore, although a clamp voltage compatible with the minimum battery voltage ensures that the specifications may be met in all conditions, it limits the output power level for higher battery voltages. Thus, the supply voltage limitation at the minimum clamp voltage results in the dynamic range of the supply voltage Vcc and thereby the output power of the power amplifier circuit 101 being substantially reduced.

Also, a clamping voltage will result in a substantial voltage drop over the FET 103 at higher battery voltages where the output power may be limited by the clamp voltage rather than the battery voltage. Since the supply current for the power amplifier flows through the FET 103, the power dissipation of the FET 103 becomes substantial thereby reducing efficiency of the power amplifier, increasing battery drain and increasing heat dissipation in the FET 103.

For example, a typical battery voltage may vary between 2.8 V and 5.5 V. If the supply voltage Vcc is clamped at e.g. 2.5 V, the dynamic range of Vcc is limited to between 0 and 2.5V even with a battery voltage of 5.5V. Furthermore, at a battery voltage of 5.5V the voltage drop over the FET 103 is 3 V for a Vcc of 2.5V. Thus, more power is dissipated in the FET 103 than in the power amplifier. The reduced dynamic range may accordingly not only reduce the output power level of the power amplifier circuit but may also increase the heat dissipation as the power which is not transmitted is dissipated in the FET 103.

Hence, an improved power amplifier module would be advantageous and in particular a power amplifier module which is practical to implement and/or allows increased flexibility, increased dynamic range of the output power, reduced heat dissipation, improved transient performance, reduced adjacent channels spurious and/or increased battery life would be advantageous. In particular a power amplifier module suitable for a TDMA communication system and providing improved output power control and/or increased coverage would be advantageous.

SUMMARY OF THE INVENTION

The present invention provides a power amplifier module and a Time Division Multiple Access radio as described in the accompanying claims.

BRIEF DESCRIPTION OF THE DRAWINGS

An embodiment of the invention will be described, by way of example only, with reference to the drawings, in which.

DETAILED DESCRIPTION OF A PREFERRED EMBODIMENT OF THE INVENTION

Figure 1:
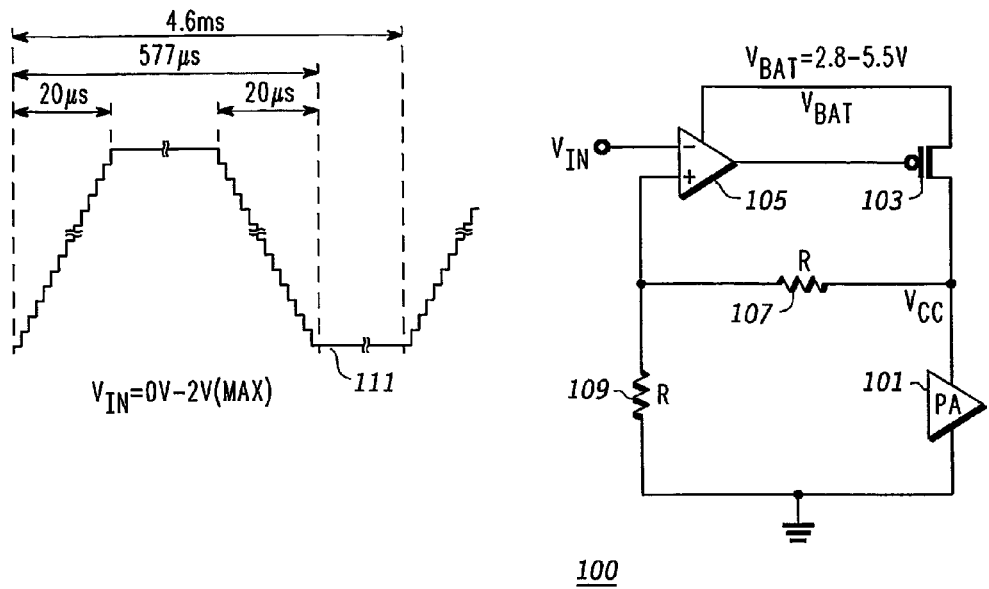
FIG. 1 illustrates power supply regulation of an output power level of a power amplifier in accordance with prior art.

The accompanying drawings show a power amplifier module comprising: an RF power amplifier circuit (201) having a power supply regulated output power level; a power supply transistor (207) coupled to the power amplifier circuit (201) and operable to control a power supply to the power amplifier circuit (201) in response to a drive signal; a drive circuit (209) coupled to the power supply transistor (207) and operable to generate the drive signal in response to a power level input signal; operating characteristic responsive means (211) responsive to a voltage across the power supply transistor (207) related to saturation of the power supply transistor (207); and a control circuit (213) coupled to the drive circuit (209) and operable to control the drive signal in response to the voltage across the power supply transistor (207).

The power amplifier may be a complete power amplifier or further functionality may be used together with the power amplifier module to provide a complete power amplifier. The power amplifier module may further be implemented in a single or plurality physical elements and may further comprise other circuits or functionality.

The drive signal is controlled to ensure that the power supply transistor remains in a desired operating range having a desired operating characteristic. Rather than clamping the power supply of the power amplifier to a specific level, a variable control of the operating conditions of the power supply transistor may be achieved. Specifically, if the power amplifier module is supplied by a variable voltage power supply, such as a battery, the entire dynamic range of the variable voltage power supply may be exploited.

This may for example allow increased dynamic range of the power supply to the power amplifier circuit, improved operation of the power supply transistor, increased dynamic range of the output power, reduced heat consumption, improved efficiency, increased coverage range of a radio unit comprising the power amplifier module, improved distortion performance, improved power control transient response and/or reduced adjacent channel spurious.

The power amplifier circuit is arranged such that the output power level depends on the power supply power and typically the power supply voltage to the power amplifier circuit. Thus, the gain of the power amplifier circuit may depend on the power supply and the output power level may be controlled by controlling the power supply to the power amplifier circuit. Specifically, the drive signal may control the output power level of the power amplifier circuit.

In the embodiment of the invention shown in the drawings, the voltage sensed, which is related to a saturation characteristic, is related to the operating point of the power supply transistor and in particular to the functionality of the power supply transistor in this operating point. Specifically, the saturation characteristic relates to a relation between the operating point of the power supply transistor and a saturation region in the characteristics of the power supply transistor. Preferably this saturation characteristic corresponds to a gain characteristic and the power supply transistor may be considered to be saturated when the power supply transistor is operated in a region wherein the gain of the power supply transistor is below a given threshold.

For example, a bipolar transistor may be considered to be saturated when it is operated in the region conventionally referred to as the saturation region whereas a FET transistor may be considered to be saturated when it is operated in the region conventionally referred to as the linear region.

Similarly, the bipolar transistor may be considered not to be saturated when it is operated in the region conventionally referred to as the normal or active region whereas a FET transistor may be considered not to be saturated when it is operated in the region conventionally referred to as the saturated region. Thus, specifically the FET may be considered not to be saturated when it predominantly operates as a gain element rather than when it predominantly operates as a variable resistive element. Accordingly, the FET is considered active and non-saturated when it is operating in the region conventionally referred to as the saturated region (the term saturated region refers to the saturation of the channel of the FET. The channel is saturated when the FET is active, i.e. when the FET is operating with high gain, and thus the channel is saturated when the FET itself is not considered saturated).

Thus direct control of the drive signal is enabled to ensure that the transistor does not become saturated. Hence, the power amplifier module may directly control operation in response to the actual operating point of the power supply transistor in the actual current circumstances rather than based on worst case assumptions. Performance may therefore be significantly improved for the majority of operating conditions of the power supply transistor and the power amplifier module.

The control circuit comprises a negative feedback loop from the means for determining to the drive circuit. The negative feedback is preferably such that if the power supply transistor is about to enter an undesirable region of operation (e.g. wherein it is considered saturated), the negative feedback loop acts to reduce or increase the drive signal to drive the power supply transistor away from the undesirable region. This allows for a simple but efficient implementation.

Preferably, the power supply transistor is a Field Effect Transistor (FET) and the control circuit is operable to control the drive signal to substantially prevent the power supply transistor from entering a FET linear region operating state.

The FET is preferably operated in the active gain region known as the saturated region and prevented from entering the linear region where performance is degraded. By directly controlling the drive signal in response to the operating characteristic of the FET, efficient control is enabled or facilitated resulting in improved performance for the current conditions. Specifically, a given output power output level spurious and transient performance is ensured while allowing increased output range of the power supply to the power amplifier circuit, improved operation of the power supply transistor, increased output power range, reduced heat consumption, improved efficiency, increased coverage range of a radio unit comprising the power amplifier module, and/or reduced spurious levels such as reduced adjacent channel interference.

The operating characteristic responsive means preferably comprises a sense transistor operable to detect a drain-gate voltage of the power supply transistor. This provides for a particularly advantageous implementation. Specifically, a simple and accurate detection of the power supply transistor entering the linear region may be implemented. Furthermore, this implementation does not necessitate passive components thereby providing an implementation particularly suitable for integrated manufacture and having reduced size.

The sense transistor is operable to conduct a current if the power supply transistor enters a FET linear region of operation, and the control circuit is operable to control the drive signal in response to the current. This provides for an advantageous implementation wherein the current conducted by the sense transistor may be detected by circuitry of the control circuit. The sense transistor may be arranged to conduct the current in accordance with any suitable definition or characterisation of the linear region and may specifically be dimensioned such that the current is conducted when an absolute sense voltage associated with the power supply transistor and coupled to the gate of the sense transistor exceeds a threshold.

The sense transistor conducts current if a drain-source voltage of the power supply transistor is below a gate-source voltage minus a threshold voltage of the power supply transistor. Specifically, the sense transistor may conduct current when $Vds \leq Vgs-Vt$ where Vds is the drain source voltage of the power supply transistor, Vgs is the gate source voltage of the power supply transistor and Vt is the threshold voltage of the power supply transistor. This provides a suitable indication of the crossover between the FET linear region and the FET channel saturated region and thus provides a suitable measure for the FET entering the linear region The control circuit is operable to reduce an absolute amplitude of the drive signal in response to the sense transistor conducting the current. This allows for a low complexity and practical implementation resulting in suitable performance.

A gate of the sense transistor is connected to a gate of the power supply transistor and a source of the sense transistor is connected to a drain of the power supply transistor. This allows for a particularly efficient and simple detection circuit. The gate of the sense transistor may directly sense a gate drain voltage of the power supply transistor.

The sense transistor has a threshold voltage similar to the threshold voltage of the power supply transistor. This allows for a particularly efficient and simple detection circuit. For example, if the gate of the sense transistor is connected to a gate of the power supply transistor and a source of the sense transistor is connected to a drain of the power supply transistor, the sense transistor will start conducting current exactly when $Vds \leq Vgs-Vt$ for the power supply transistor.

In use, the supply voltage for the power supply transistor may be a variable voltage. The supply voltage may for example be from a battery providing a voltage that varies as the battery is discharged. The performance of the power amplifier module supplied with a varying voltage is improved and may in particular provide performance suitable for the current supply voltage rather than being limited to a worst case supply voltage.

The power supply transistor is preferably a bipolar transistor. The control circuit is operable to control the drive signal to substantially prevent the power supply transistor from entering a bipolar transistor saturated region. The bipolar transistor has undesirable gain performance in the saturated region and improved transient and/or spurious performance of the power amplifier module may be achieved by preventing the power supply transistor entering the saturated region.

The following description focuses on an embodiment of the invention applicable to a power amplifier module for a radio in a TDMA cellular communication system such as GSM (Global System for Mobile communication). However, it will be appreciated that the invention is not limited to this application.

Although the description refers to a power amplifier module and describes this as an integrated unit, it will be clear that the term simply refers to a functional module and does not imply any physical, functional or logical restriction. The power amplifier module may be implemented in any suitable form and may specifically be partitioned, located, distributed and physically, logically or functionally combined with any other circuitry in any suitable form.

Figure 2:
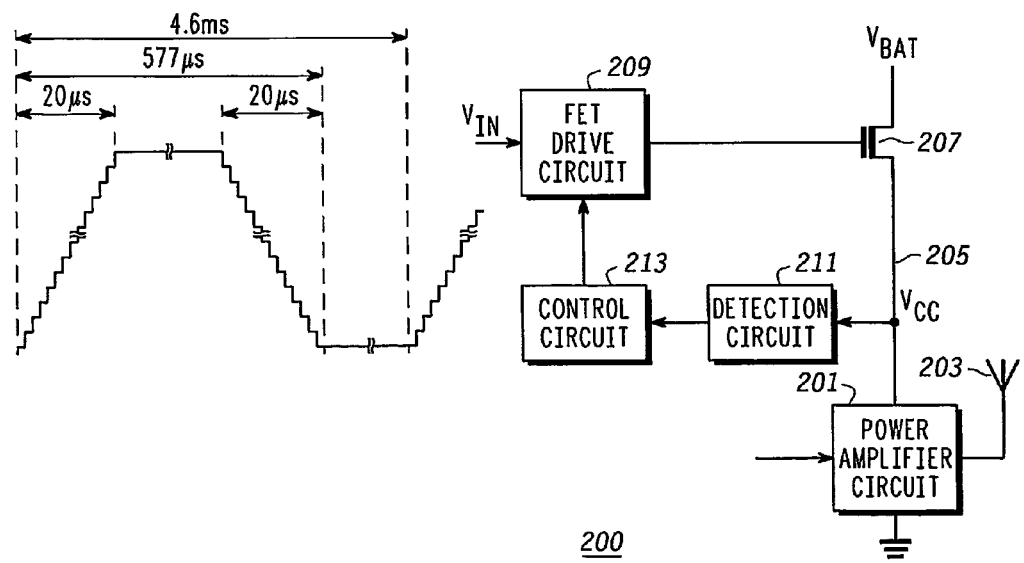
FIG. 2 illustrates a power amplifier module in accordance with an embodiment of the invention.

FIG. 2 illustrates a power amplifier module 200 in accordance with an embodiment of the invention. The power amplifier module 200 comprises a power amplifier circuit 201 which is operable to receive an input signal and amplify it to a suitable output power level. The power amplifier circuit 201 is coupled to an antenna 203 which converts the amplified signal to electromagnetic radio waves. The power amplifier circuit 201 has a power supply regulated output power level. Thus, the power amplifier circuit 201 is constructed such that the output power level and the gain of the power amplifier circuit 201 depends on the power supply, and specifically on the supply voltage, as is well known in the art.

A power supply input 205 of the power amplifier circuit 201 is coupled to a drain of a PMOS FET 207. The source of the FET 207 is coupled to a power supply which provides a variable voltage. The power supply is in the specific example a battery (not shown) which provides a voltage which varies depending on the charge state of the battery. In the example, the battery voltage $V_{Bat}$ varies between 2.8V and 5.5V.

The gate of the FET 207 is connected to a drive circuit 209 which generates a drive signal. The drive circuit 209 controls the supply voltage Vcc at the power supply input 205 by adjusting the drive signal to provide the desired supply voltage Vcc. The desired supply voltage Vcc is determined by a power level input signal Vin input to the drive circuit 209. The drive circuit 209 accordingly controls the supply voltage Vcc in response to the input signal Vin to provide the required output voltage.

It will be appreciated that the drive circuit 209 may drive the FET 207 to provide the supply voltage Vcc in any suitable way. In the described embodiment, the drive circuit comprises an operational amplifier (op-amp) coupled to the FET 207 as in the prior art example of FIG. 1. Hence, the source of the FET 207, and thus the power supply input 205 of the power amplifier circuit 201, may be coupled to drive circuit 209 through a resistive divider as in the circuit of FIG. 1. Thus, when the FET 207 operates in the active gain region, also known as the saturated region, the drive circuit 209 controls the supply voltage Vcc to be proportional to the input voltage Vin.

However, in contrast to the circuit of FIG. 1, the drive signal of the power amplifier module 200 of FIG. 2 is not just controlled by the input voltage and a resistive gain feedback coupling. Rather, the power amplifier module 200 of FIG. 2 further comprises a negative feedback loop responsive to an operating characteristic of the FET. Thus, the power amplifier module 200 of FIG. 2 further comprises functionality for controlling not only the supply voltage Vcc but also the operating conditions of the FET 207.

The power amplifier module 200 comprises a detection circuit 211 which is operable to determine an operating characteristic of the power supply transistor. The feedback loop may be responsive to any suitable operating characteristic and accordingly the detection circuit 211 may be coupled to the FET 207 in any suitable way. Preferably, the detection circuit 211 is electrically connected to the FET 207 and measures electrical voltages and/or currents associated with the drain, source and gate of the FET 207 in order to determine a current operating characteristic. However, in other embodiments other parameters and/or couplings may additionally or alternatively be used. For example, a temperature sensitive resistor may be physically located to measure an operating temperature of the FET 207 and used to control the thermal operating conditions of the FET 207.

In the described embodiment, the operating characteristic determined by the detection circuit 211 relates to a saturation characteristic of the FET 207. In this context, the term saturation may be considered to relate to the gain of the FET 207 in the current operating point. Specifically, the FET 207 is considered to be saturated when operating in a region of low gain and it may be considered to be non-saturated when operating in a region having a higher gain.

In the following, the FET 207 will be considered to be saturated when it operates in the FET linear region. In this region, the drain source current through a FET depends strongly on the drain source voltage. The relationship between the drain-source voltage and the drain-source current is relatively linear with a proportionality factor given by the gate-source voltage. consequently, in the linear region, the FET predominantly operates as a variable resistor having a value determined by the gate-source voltage.

The FET will be considered to be active and non-saturated when it operates in the region generally referred to as the FET saturated region (the term saturated here relates to the channel of the FET rather than the FET as whole). In this region, the drain-source current has only a small dependency on the drain-source voltage and is almost exclusively determined by the gate-source voltage. Thus, in the FET saturated region, the FET substantially operates like a transconductive gain element. For clarity, the term active region will in the following be used for the FET operating in a gain element operating condition.

It is clear that the regulation of the supply voltage Vcc by the drive circuit is preferably independent of the supply current through the FET 207. Thus, the FET 207 is preferably maintained in the active region. Furthermore, if the FET enters the linear region, the dynamics of the drive circuit 209 control is substantially changed leading to reduced transient and increased spurious performance. Therefore, the power amplifier module 200 of FIG. 2 comprises functionality for controlling the operating conditions of the FET 207 such that the FET 207 does not substantially enter the linear region but predominantly stays in the active region.

In the described embodiment, the detection circuit 211 is connected to the gate and source of the FET 207 and measures the gate-source voltage Vgs and the drain-source voltage Vds. Furthermore, the threshold voltage Vt of the FET 207 is known by the detection circuit 211. In the embodiment, the detection circuit 211 simply determines whether the FET 207 is in the linear region or in the active region based on the measured voltages. Specifically, the FET is considered to be in the linear region when Vds≦Vgs−Vt and in the active region otherwise.

In other embodiments, other criteria for entering the linear region may be used. For example, it may be considered that the FET is entering the linear region when $$Vds \leq Vgs - Vt + Vm$$

wherein Vm is a suitable value introduced to provide a sufficient margin ensuring that the FET is operated well within the active region.

The detection circuit 211 is furthermore coupled to a control circuit 213 which is operable to control the drive signal in response to the operating characteristic. Thus, the control circuit 213 is coupled to the drive circuit and comprises functionality for controlling the drive circuit 209 to modify the drive signal in response to the determination of the detection circuit 211. Thus, the detection circuit 211 and the control circuit 213 together with the drive circuit 209 and the FET 207 form a feedback loop that may directly control the operating conditions of the FET 207. The feedback loop may allow for the supply voltage Vcc being restricted only by the actual current operating conditions rather than being based on a worst case assumption.

As a specific example, if the battery voltage is low (e.g. 2.8V) and a high output power is required from the power amplifier circuit 201, Vin may be such that it will seek to drive the supply voltage Vcc to a voltage close to or higher than the battery voltage (e.g. 4 V). However, as the supply voltage Vcc is driven towards this value, the drive signal will increase such that the drain-source voltage Vds of the FET 207 is reduced while the gate-source voltage Vgs increases. The FET 207 is consequently driven towards the linear mode. However, this will be detected by the detection circuit 211, and specifically when Vds drops to a value equal to Vgs-Vt, the detection circuit 211 will indicate that the FET 207 is just entering the linear region from the active region. In response, the control circuit 213 provides an input to the drive circuit 209 which results in the drive signal being reduced thereby preventing that the FET 207 enters the linear region and ensuring that it stays in the active region.

Thus, the drive signal is determined by the input voltage Vin until this reaches a level that for the current operating parameters would cause the FET 207 to enter the linear region. At this stage, the control loop comprising the detection circuit 211 and control circuit 213 takes over and restricts the drive signal such that the FET 207 is maintained in the active region.

Thus, the supply voltage Vcc is not restricted or clamped to a specific low voltage determined by the worst case conditions such as the minimum battery voltage. Rather, the supply voltage Vcc is restricted only to the extent that this is necessary to maintain the FET 207 in the active region for the current operating parameters of the power amplifier module 200. This limitation depends directly on the actual current operating conditions of the FET 207 and therefore is optimised for the current conditions rather than based on a worst case assumption. For example, the restriction of the supply voltage Vcc is not fixed but depends on the battery voltage. For higher battery voltages, Vds≦Vgs−Vt occurs at a higher supply voltage Vcc thereby providing for an increased dynamic range than at lower voltages.

Accordingly, the supply voltage Vcc and the output power level of the power amplifier module 200 is limited by the actual current battery voltage rather than the lowest battery voltage. As a consequence, a significantly larger dynamic range of the supply voltage and the output power level may be provided at higher battery voltages. The transmit power and the coverage of the radio is limited by the actual battery voltage rather than the worst case assumption. Furthermore, the increased dynamic range may result in the heat dissipated in the FET being reduced thereby leading to higher efficiency and longer life time.

Also, the increased dynamic range of the supply voltage Vcc reduces the distortion introduced by the restriction of the supply voltage Vcc thereby providing less adjacent channel spurious. Alternatively or additionally, the feedback loop may prevent that the input voltage Vin is limited or clamped to a voltage sufficiently low to prevent distortion in all circumstances, and specifically to a voltage low enough to ensure that no distortion occurs at the lowest battery voltage. Hence, the feedback loop prevents that the performance of the power amplifier module is optimised for the minimum battery voltage but rather is optimised for the actual battery voltage.

In the described embodiment, the input signal not only determines the steady state output power level but also provides an envelope shaping and power ramping consistent with the technical specifications of the GSM system. The increased dynamic range provides an improved power ramping and transient response for higher output power levels and higher battery voltages.

Figure 3:
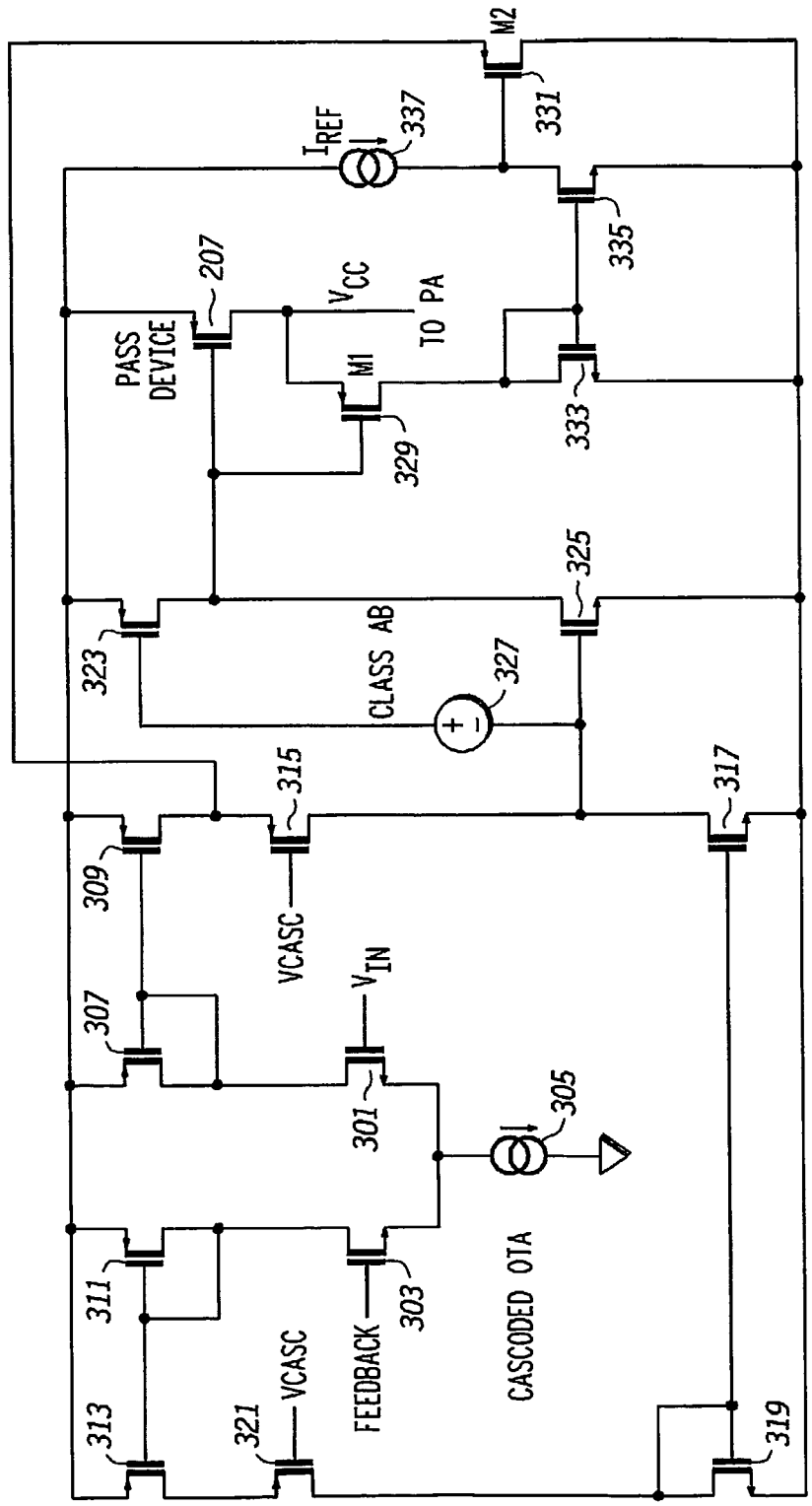
FIG. 3 illustrates a detailed schematic of a drive circuit 209, control circuit 213 and detection circuit 211 in accordance with an embodiment of the invention.

FIG. 3 illustrates a detailed schematic of the drive circuit 209, control circuit 213 and detection circuit 211. The operation of this circuit will be described in further detail.

In the circuit of FIG. 3, the drive circuit 209 is substantially implemented as a differential amplifier. The drive circuit 209 comprises an input differential amplifier stage formed by transistors 301 and 303 and current sink 305. The current in the current sink 305 is split between transistors 301 and 303 dependent on the gate voltage at each of these. The input voltage Vin is fed to the gate of the first transistor 301 and the feedback signal is fed to the gate of the second transistor 303. The feedback signal corresponds to the supply voltage Vcc fed to the feedback input through a resistive divider (not shown) as in the example of FIG. 1.

The drain of the first transistor 301 is fed to a current mirror formed by transistors 307 and 309. Thus, the current flowing through transistor 301 is mirrored to transistor 309. Similarly, the drain of the second transistor 303 is fed to a current mirror formed by transistors 311 and 313. Thus, the current flowing through transistor 303 is mirrored to transistor 313.

The drain of transistor 309 is through a cascode transistor 315 connected to a first input of a current mirror formed by transistors 317 and 319. The drain of transistor 313 is through a second cascode transistor 321 coupled to a second input of the current mirror formed by transistors 317 and 319.

The cascode transistors 315 and 321 reduce the drain voltage variations of the current mirrors thereby providing for an improved current imaging performance.

Hence, the input circuitry is symmetric with respect to Vin and the feedback signal. When the input signal Vin is equal to the feedback signal, the circuit is in balance and the current in the symmetric branches is substantially identical. However, if the input voltage Vin increases, more current will flow through the first transistor 301 and less through the second transistor 303. This leads to an increased current through transistor 309 and reduced current through transistor 313 and thus transistor 319. As transistors 319 and 317 are coupled as a current mirror, the current through transistor 317 is also reduced and accordingly transistor 309 is attempting to source more current than transistor 317 can sink thereby resulting in a differential current that will result in a large voltage increase at the drain of transistor 317. Thus, a high gain differential gain stage is achieved.

The drain of transistor 317 is connected to a class AB inverting gain stage comprising transistors 323, 325 and level shifter 327. The class AB inverting gain stage provides a high current drive capability which improves the transient performance of the system by being able to rapidly charge and discharge the large gate capacitance of a power FET.

The output of the class AB inverting gain stage is connected to the gate of the power FET 207. When Vin is sufficiently low so that the FET 207 is in the active high gain region, the performance of the control functionality for regulating the supply voltage Vcc is given by the circuitry described above. Thus, the drive circuit 209 will operate as a differential high gain amplifier that will drive the output drive signal and thus the supply voltage Vcc such that the input voltage Vin is equal to the feedback voltage. For a feedback coupling comprising a resistive divider, the resulting amplification from Vin to the supply voltage Vcc is given by the divide ratio of the resistive divider as is well known in the art.

However, if Vin seeks to drive the supply voltage Vcc too high relative to the battery voltage $V_{Bat}$, the FET 207 will begin to enter the linear region as previously described.

In order to prevent this, the circuit of FIG. 3 comprises a detection circuit 211 comprising a single sense transistor 329. The sense transistor 329 is coupled to the FET 207 such that a gate of the sense transistor 329 is connected to a gate of the power supply transistor 207 and a source of the sense transistor 329 is connected to a drain of the power supply transistor 207.

The sense transistor is in the described embodiment dimensioned to have the same threshold voltage Vt as the FET 207. Referring to the terminals of the FET 207, the gate-source voltage $V_{sense}$ of the sense transistor 329 is given by:

$$V_{sense} = Vgd = Vgs - Vds.$$

The sense transistor will be inactive when the sense voltage $V_{sense}$ is less than Vt and will start to conduct current when $$V_{sense} = Vgs - Vds = Vt$$

Thus the sense transistor will conduct current when $$Vds \leq Vgs - Vt$$

In other words, the sense transistor will in this embodiment start to conduct current exactly when FET 207 enters the linear region. Thus, a very simple and effective detection circuit 211 comprising only a single transistor is provided.

In some embodiments, the threshold voltages may be different for the FET 207 and the sense transistor 329. Specifically, the threshold voltage of the sense transistor may be designed to be lower than the threshold voltage of the FET 207 in order to provide a margin with respect to the FET 207 entering the linear region.

It will be appreciated that a more complex detection circuit 211 may be used in other embodiments. For example, a more complex criterion for determining an operating characteristic of the FET may be used and this may for example depend on other and/or more accurate measurements or detections of the voltages and/or currents of the drain, source and gate of the FET 207.

The sense transistor 329 is coupled back to the drive circuit 209 and specifically to the drain of transistor 309 through a control circuit 213. The control circuit 213 specifically comprises an output transistor 331 which through a current mirror is coupled to the sense transistor 329. The output transistor 331 is connected to a signal junction in the drive circuit in the form of the drain of transistor 309. The output transistor becomes active when the sense transistor switches on and starts to conduct current. When the output transistor 331 becomes active, it draws current from the drain of transistor 309 thereby reducing the voltage at the input of the class AB inverting gain stage and thus increasing the gate voltage at of FET 207 resulting in a reduced gate-source voltage.

In more detail, the sense transistor 329 is coupled to a first input of a current image formed by transistors 333 and 335 and the gate of the output transistor 331 is connected to a second input of this current image circuit. The gate of the output transistor 331 is further coupled to a current source 337 which may be formed by a transistor having source and gate coupled together to provide a relatively constant current source having a relatively high impedance.

When the sense transistor 329 is switched off, substantially no current flows through either input of the current image (i.e. through transistor 333 or transistor 335) and the current source 337 causes the gate of the output transistor 331 to remain high and thereby to be switched off.

When the FET 207 approaches the linear region and the sense transistor starts conducting current, the current is mirrored to the drain of transistor 335. If the current is higher than the current of the current source 337, the gate of the output transistor is drawn lower and the output transistor 331 switches on. The output transistor 331 consequently starts drawing current from the drain of transistor 309 thereby causing the voltage at the drain of transistor 317 to reduce. This is coupled to the gate of the FET 207 through the inverting class AB stage thereby causing the gate voltage of the FET 207 to be increased and the gate source voltage to decrease. This restricts the supply voltage Vcc and thereby prevents the FET 207 from entering the linear region.

Thus, the circuit of FIG. 3 provides for a power amplifier module 200 having improved performance with respect to the prior art.

Figure 4:
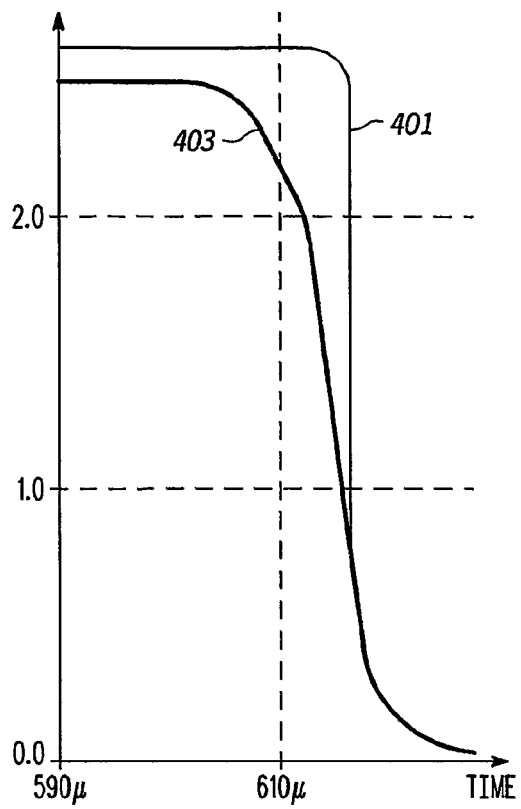
FIG. 4 illustrates a comparison of a transient response between a power amplifier module in accordance with prior art and a power amplifier module in accordance with an embodiment of the invention.

FIG. 4 illustrates a comparison between a power amplifier module in accordance with prior art and a power amplifier module in accordance with an embodiment of the invention. Curve 401 illustrates the transient response of a power amplifier as illustrated in FIG. 1 to a GSM power down ramp input signal. Curve 403 illustrates the transient response of a power amplifier module as illustrated in FIG. 3 to a GSM power down ramp input signal. It is clear that the circuit of FIG. 4 provides a much smoother and less square power ramp thereby significantly reducing the spurious at higher frequencies. Specifically, FIG. 4 illustrates the effect of the inclusion of the feed back control loop, for Vin larger than the battery voltage when this is at the lowest voltage of 2.8V. FIG. 4 clearly illustrates the requirement for and benefit of introducing the feedback control loop.

Figure 5:
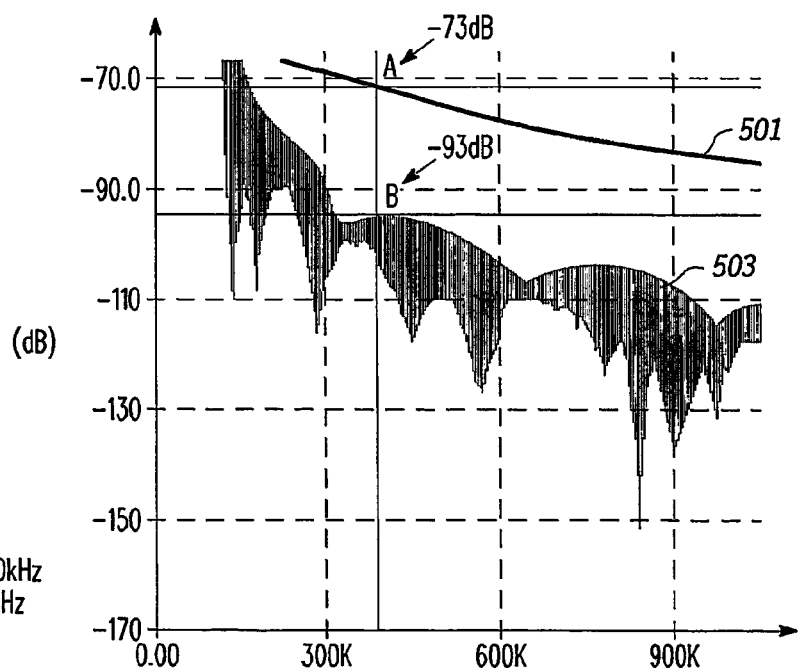
FIG. 5 illustrates a comparison of spurious spectra from a power amplifier module in accordance with prior art and a power amplifier module in accordance with an embodiment of the invention.

This is more clearly illustrated in FIG. 5, wherein the corresponding spectra are illustrated. Curve 501 illustrates the frequency spectrum for a power amplifier as illustrated in FIG. 1 to a GSM power down ramp input signal. Curve 503 illustrates the frequency spectrum for a power amplifier module as illustrated in FIG. 3 to a GSM power down ramp input signal.

It can be noted that the power amplifier module of FIG. 3 has spurious levels approximately 20 dB lower than that of FIG. 1. Thus, whereas the circuit of FIG. 1 fails to meet the GSM specifications, the circuit of FIG. 3 meets these with a substantial margin.

It will be appreciated that although the above description has focussed on a description applicable to a power supply transistor which is a Field Effect Transistor, the invention is equally applicable to a bipolar transistor.

Specifically, for a bipolar transistor the detection circuit preferably detects if the bipolar transistor may be close to entering the region known as the saturated region. In the saturated region, the collector current depends strongly on the collector emitter voltage and the gain is low. Consequently, the bipolar transistor is preferably operated in the active region where the gain is high and the dependency of the collector current on the collector emitter voltage is low.

The detection circuit for a bipolar transistor may be similar to that described for a FET transistor, and specifically a transistor may be coupled to conduct current when the collector-base voltage falls below a given value.

The invention can be implemented in any suitable form. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units and modules. Specifically, some or all of the elements of the power amplifier module may be implemented as a single physical module on a single die.

Although the present invention has been described in connection with the preferred embodiment, it is not intended to be limited to the specific form set forth herein. Rather, the scope of the present invention is limited only by the accompanying claims. In the claims, the term comprising does not exclude the presence of other elements or steps. Furthermore, although individually listed, a plurality of means, elements or method steps may be implemented by e.g. a single unit or processor. Additionally, although individual features may be included in different claims, these may possibly be advantageously combined, and the inclusion in different claims does not imply that a combination of features is not feasible and/or advantageous. In addition, singular references do not exclude a plurality. Thus references to "a", "an", "first", "second" etc do not preclude a plurality.

The invention claimed is:

1. A power amplifier module, comprising
a power amplifier circuit having a power supply regulated output power level;
a power supply transistor coupled to the power amplifier circuit and operable to control a power supply to the power amplifier circuit in response to a drive signal, wherein the power supply transistor is a Field Effect Transistor;
a drive circuit coupled to the power supply transistor and operable to generate the drive signal in response to a power level input signal;
a detection circuit for determining an operating characteristic of the power supply transistor; and
a control circuit coupled to the drive circuit and operable to control the drive signal in response to the operating characteristic;
wherein the control circuit is operable to control the drive signal to substantially prevent the power supply transistor from entering a FET linear region operating state; and the detection circuit comprises a sense transistor operable to detect a drain-gate voltage of the power supply transistor; the sense transistor conducting current if the power supply transistor enters a FET linear region of operation and if a drain-source voltage of the power supply transistor is below a gate-source voltage minus a threshold voltage of the power supply transistor; and the control circuit is operable to control the drive signal in response to the current.

2. A power amplifier module, comprising;
a power amplifier circuit having a power supply regulated output power level;
a power supply transistor coupled to the power amplifier circuit and operable to control a power supply to the power amplifier circuit in response to a drive signal, wherein the power supply transistor is a Field Effect Transistor;
a drive circuit coupled to the power supply transistor and operable to generate the drive signal in response to a power level input signal;
a detection circuit for determining an operating characteristic of the power supply transistor;
a control circuit coupled to the drive circuit and operable to control the drive signal in response to the operating characteristic,
wherein the detection circuit comprises a sense transistor operable to detect a drain- gate voltage of the power supply transistor and to conduct a current if the power supply transistor enters a FET linear region of operation; and
the control circuit is operable to control the drive signal in response to the current and to control the drive signal to substantially prevent the power supply transistor from entering a FET linear region operating state and to reduce an absolute amplitude of the drive signal in response to the sense transistor conducting the current.

3. A power amplifier module, comprising;
a power amplifier circuit having a power supply regulated output power level;
a power supply transistor coupled to the power amplifier circuit and operable to control a power supply to the power amplifier circuit in response to a drive signal, wherein the power supply transistor is a Field Effect Transistor;
a drive circuit coupled to the power supply transistor and operable to generate the drive signal in response to a power level input signal;
a detection circuit for determining an operating characteristic of the power supply transistor; and
a control circuit coupled to the drive circuit and operable to control the drive signal in response to the operating characteristic,
wherein the detection circuit comprises a sense transistor operable to detect a drain-gate voltage of the power supply transistor and to conduct a current if the power supply transistor enters a FET linear region of operation and wherein a gate of the sense transistor is connected to a gate of the power supply transistor and a source of the sense transistor is connected to a drain of the power supply transistor; and
wherein the control circuit is operable to control the drive signal in response to the current and to control the drive signal to substantially prevent the power supply transistor from entering a FET linear region operating state.

4. A power amplifier module, comprising:
a power amplifier circuit having a power supply regulated output power level;
a power supply transistor coupled to the power amplifier circuit and operable to control a power supply to the power amplifier circuit in response to a drive signal, wherein the power supply transistor is a Field Effect Transistor;
a drive circuit coupled to the power supply transistor and operable to generate the drive signal in response to a power level input signal;
a detection circuit for determining an operating characteristic of the power supply transistor; and
a control circuit coupled to the drive circuit and operable to control the drive signal in response to the operating characteristic,
wherein the control circuit is operable to control the drive signal to substantially prevent the power supply transistor from entering a FET linear region operating state and the detection circuit comprises a sense transistor operable to detect a drain- gate voltage of the power supply transistor, which sense transistor has a threshold voltage similar to the threshold voltage of the power supply transistor.

5. A power amplifier module, comprising;
a power amplifier circuit having a power supply regulated output power level;
a power supply transistor coupled to the power amplifier circuit and operable to control a power supply to the power amplifier circuit in response to a drive signal, wherein the power supply transistor is a Field Effect Transistor;
a drive circuit coupled to the power supply transistor and operable to generate the drive signal in response to a power level input signal;

a detection circuit for determining an operating characteristic of the power supply transistor; and a control circuit coupled to the drive circuit and operable to control the drive signal in response to the operating characteristic, wherein the control circuit is operable to control the drive signal to substantially prevent the power supply transistor from entering a FET linear region operating state; and the detection circuit comprises a sense transistor operable to detect a drain-gate voltage of the power supply transistor; and wherein the control circuit comprises an output transistor coupled to the sense transistor and to a signal junction in the drive circuit such that if the sense transistor conducts current, the output transistor becomes active and causes a signal level at the signal point to be reduced.

6. A power amplifier module as claimed in claim 5, wherein the sense transistor is connected to a first input of a current image circuit and the output transistor is connected to a second input of the current image circuit.

7. A power amplifier module as claimed in claim 3, wherein a supply voltage for the power supply transistor is a variable voltage.

8. A power amplifier module as claimed in claim 2, wherein the sense transistor conducts current if a drain-source voltage of the power supply transistor is below a gate-source voltage minus a threshold voltage of the power supply transistor.

9. A power amplifier module as claimed in claim 4, wherein the sense transistor is operable to conduct a current if the power supply transistor enters a FET linear region of operation and the control circuit is operable to control the drive signal in response to the current and wherein the sense transistor conducts current if a drain-source voltage of the power supply transistor is below a gate-source voltage minus a threshold voltage of the power supply transistor.

10. A power amplifier module as claimed in claim 3, wherein the control circuit is operable to reduce an absolute amplitude of the drive signal in response to the sense transistor conducting the current.

11. A power amplifier module as claimed in claim 4, wherein the sense transistor is operable to conduct a current if the power supply transistor enters a FET linear region of operation and the control circuit is operable to control the drive signal in response to the current and wherein a gate of the sense transistor is connected to a gate of the power supply transistor and a source of the sense transistor is connected to a drain of the power supply transistor.

12. A power amplifier module as claimed in claim 4, wherein the sense transistor is operable to conduct a current if the power supply transistor enters a FET linear region of operation and the control circuit is operable to control the drive signal in response to the current;

and wherein a gate of the sense transistor is connected to a gate of the power supply transistor and a source of the sense transistor is connected to a drain of the power supply transistor.

13. A power amplifier module as claimed in claim 5, wherein the control circuit comprises an output transistor coupled to the sense transistor and to a signal junction in the drive circuit such that if the sense transistor conducts current, the output transistor becomes active and causes a signal level at the signal point to be reduced.

14. A power amplifier module as claimed in claim 3, wherein the sense transistor conducts current if a drain-source voltage of the power supply transistor is below a gate-source voltage minus a threshold voltage of the power supply transistor.

15. A power amplifier module as claimed in claim 5, wherein the sense transistor is operable to conduct a current if the power supply transistor enters a FET linear region of operation and the control circuit is operable to control the drive signal in response to the current and wherein the sense transistor conducts current if a drain-source voltage of the power supply transistor is below a gate-source voltage minus a threshold voltage of the power supply transistor.

16. A power amplifier module as claimed in claim 5, wherein the sense transistor is operable to conduct a current if the power supply transistor enters a FET linear region of operation and the control circuit is operable to control the drive signal in response to the current and wherein a gate of the sense transistor is connected to a gate of the power supply transistor and a source of the sense transistor is connected to a drain of the power supply transistor.

17. A power amplifier module as claimed in claim 5, wherein the sense transistor is operable to conduct a current if the power supply transistor enters a FET linear region of operation and the control circuit is operable to control the drive signal in response to the current;

and wherein a gate of the sense transistor is connected to a gate of the power supply transistor and a source of the sense transistor is connected to a drain of the power supply transistor.

18. A power amplifier circuit having a power supply regulated output power level;

a power supply transistor coupled to the power amplifier circuit and operable to control a power supply to the power amplifier circuit in response to a drive signal;

a drive circuit coupled to the power supply transistor and operable to generate the drive signal in response to a power level input signal;

a detection circuit for determining an operating characteristic of the power supply transistor; and a control circuit coupled to the drive circuit and operable to control the drive signal in response to the operating characteristic, wherein the detection circuit comprises a sense transistor operable to detect a collector-base voltage or a source-gate voltage of the power supply transistor, and the sense transistor is operable to conduct a current if the power supply transistor enters a linear region of operation and the control circuit is operable to control the drive signal in response to the current and to reduce an absolute amplitude of the drive signal in response to the sense transistor conducting the current.

19. A power amplifier circuit having a power supply regulated output power level;

a power supply transistor coupled to the power amplifier circuit and operable to control a power supply to the power amplifier circuit in response to a drive signal;

a drive circuit coupled to the power supply transistor and operable to generate the drive signal in response to a power level input signal;

a detection circuit for determining an operating characteristic of the power supply transistor; and a control circuit coupled to the drive circuit and operable to control the drive signal in response to the operating characteristic;

wherein the detection circuit comprises a sense transistor operable to detect a collector-base voltage or a source-gate voltage of the power supply transistor, and wherein the sense transistor has a threshold voltage similar to a threshold voltage of the power supply transistor.

20. A power amplifier circuit having a power supply regulated output power level;

a power supply transistor coupled to the power amplifier circuit and operable to control a power supply to the power amplifier circuit in response to a drive signal;

a drive circuit coupled to the power supply transistor and operable to generate the drive signal in response to a power level input signal;

a detection circuit for determining an operating characteristic of the power supply transistor; and a control circuit coupled to the drive circuit and operable to control the drive signal in response to the operating characteristic, wherein the detection circuit comprises a sense transistor operable to detect a collector-base voltage or a source-gate voltage of the power supply transistor, and wherein the control circuit comprises an output transistor coupled to the sense transistor and to a signal junction in the drive circuit such that if the sense transistor conducts current, the output transistor becomes active and causes a signal level at the signal point to be reduced.

* * * * *